(12) United States Patent
Keller et al.

(10) Patent No.: US 6,536,021 B2
(45) Date of Patent: Mar. 18, 2003

(54) METHOD AND SYSTEM FOR REPRESENTING HIERARCHICAL EXTRACTED RESISTANCE-CAPACITANCE FILES OF A CIRCUIT MODEL

(75) Inventors: S Brandon Keller, Fort Collins, CO (US); Gregory Dennis Rogers, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 63 days.

(21) Appl. No.: 09/782,407

(22) Filed: Feb. 12, 2001

(65) Prior Publication Data

US 2002/0112216 A1 Aug. 15, 2002

(51) Int. Cl.$^7$ .............................. G06F 17/50
(52) U.S. Cl. .............................. 716/4; 716/5
(58) Field of Search .................. 716/1–14; 703/16, 703/15; 707/104

(56) References Cited

U.S. PATENT DOCUMENTS

| | | | | |
|---|---|---|---|---|
| 4,831,543 A | * | 5/1989 | Mastellone | 716/2 |
| 5,301,318 A | * | 4/1994 | Mittal | 707/104.1 |
| 5,815,402 A | * | 9/1998 | Taylor et al. | 703/15 |
| 5,903,475 A | * | 5/1999 | Gupte et al. | 703/16 |
| 6,113,647 A | * | 9/2000 | Silve et al. | 716/11 |
| 6,301,691 B1 | * | 10/2001 | McBride | 716/2 |

\* cited by examiner

*Primary Examiner*—Vuthe Siek
*Assistant Examiner*—Sun James Lin

(57) ABSTRACT

A method is disclosed for storing a circuit design in memory of a computer system and analyzing the design using an electronic computer-aided design (E-CAD) tool. The design may include hierarchical cells for repeated elements and groups of elements. A flat data structure is created to represent a specified portion of the circuit between two terminal nodes. For each node and edge in the specified portion, the flat data structure stores a name, an address pointer to the underlying data in the circuit model, and address pointers to adjoining nodes or edges in the flat data structure. Also for each node and edge in the design, the data structure stores an indicator showing whether the node or edge has been analyzed. The E-CAD analysis is performed on the flat representation, the results are recorded, and the flat data structure is deleted from memory.

20 Claims, 8 Drawing Sheets

METHOD AND SYSTEM FOR REPRESENTING HIERARCHICAL EXTRACTED RESISTANCE-CAPACITANCE FILES OF A CIRCUIT MODEL

FIELD OF INVENTION

The present invention relates generally to computer software for the design of semiconductor chips. More particularly, it relates to a method of processing data for analyzing a chip design stored in a computer memory.

BACKGROUND

In the field of semiconductor chip design and particularly very large scale integration (VLSI) chip design, a design may be stored in a computer memory for analysis. For example, the designer may wish to test the current or signal response through particular metal segments or conductors in the design. The individual nodes, signals, components, conductors, and other information are stored as a computer model in the computer database and used for design calculations and testing.

The computer model may include cross-references to save memory. For example, sometimes a particular series of components may be repeated in the design. The design may represent these related components in a single cell and store the cell to memory. Wherever the cell appears in the design, the computer model may merely have a reference to it, rather than storing all of its information every time it appears. This model is referred to as a hierarchical design, as opposed to a flat data representation. The hierarchical model may extend to groups of cells, and groups of groups, etc. as called for by the design. Wherever a series of items is repeated, the computer model may store the data in a hierarchy of cross-references.

One difficulty with the hierarchical model is that it is cumbersome and time-consuming to traverse. It requires multiple cross-references, increasing the time required to perform an analysis of the design. The alternative design model is the flat data representation, in which every element of the design is stored in full every time it appears in the design. The same data is stored multiple times because there are no cross-references. The flat data representation requires less time for analysis, but it is impractical to use because it requires too much storage memory to represent the entire design.

Another problem with analysis of circuit designs is that a particular design portion under test may have multiple paths between two nodes. For example, an electronic computer-aided design (E-CAD) tool may be run on the circuit design to analyze particular characteristics of a design portion, such as current along a specified path. The E-CAD tool retrieves the information from the design stored in memory, traversing the hierarchy as necessary. In its analysis, the E-CAD tool may need to traverse all of the paths between two nodes to ensure that it has analyzed each path. At the same time, the tool needs to make sure it does not analyze the same path twice, by looping back for example. Existing methods do not provide an efficient means of preventing the tool from analyzing the same portion of the design twice.

What is needed is a more efficient method for storing and processing chip design data to decrease required processing time without significantly affecting memory storage. What is also needed is a more efficient means of analyzing hierarchical data using a circuit analysis tool. What is also needed is a more efficient means of avoiding looping in the analysis of the design.

SUMMARY OF INVENTION

A method is disclosed for storing, for example, a very large scale integration (VLSI) circuit design in memory of a computer system and analyzing the design using an electronic computer-aided design (E-CAD) tool. The design may include hierarchical cells for repeated elements and groups of elements. A data structure is created to represent a specified portion of the circuit, such as a signal between two nodes. For each net in the specified portion, the data structure creates a node that stores a name, an address pointer to the underlying data in the circuit model, and address pointers to adjoining edges in the data structure. For each device between nets, the data structure creates an edge that stores a name, an address pointer to the underlying cell information in the circuit model, and address pointers to adjoining nodes. Also, the data structure stores an indicator showing whether each node or edge in the signal has been analyzed.

The circuit design is analyzed on a signal-by-signal basis using the E-CAD tool. The method selects a signal for analysis, creates a flat data representation for the signal, and stores it in memory. The E-CAD tool then performs its analysis on the flat representation and records the results in its ordinary operation. When the signal analysis is complete, the flat representation is deleted from memory, and other signals may be analyzed in turn.

DETAILED DESCRIPTION

Figure 1:
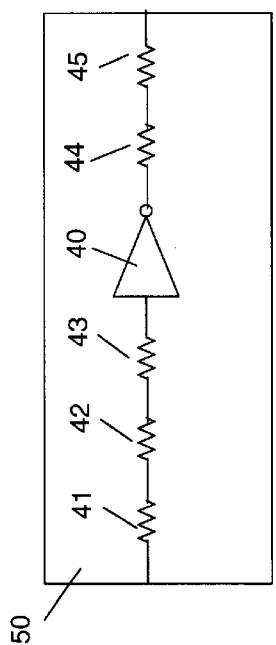
FIG. 1 shows a schematic representation of a cell.

FIG. 1 illustrates the use of design hierarchical cells in the computer modeling of a design for a circuit, such as an integrated circuit (IC). FIG. 1 shows a schematic of a cell 50 having an inverter 40 connected to a plurality of resistors 41, 42, 43, 44, 45. The cell 50 may represent the components of a segment that is stored as a computer model of a circuit design stored in a computer memory. In use, a design may repeat the same components in cell 50 several times. A cell 50 allows the designer to create the specific components, such as the inverter 40 and resistors 41, 42, 43, 44, 45, just once, and then repeat the contents of the cell wherever the connection and components repeat themselves.

Figure 2:
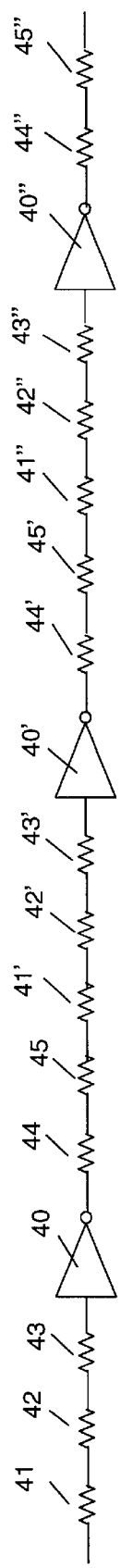
FIG. 2 shows a flat representation of a schematic of multiple cells.

For example, a single design may have three inverters connected in series using segments of the same character;

that is, having the same physical dimensions and properties. FIG. 2 shows an example of the contents of three cells 50 connected in series without reference to the general cell concept. The connection results in the series connection of the first inverter 40, the first set of resistors 41, 42, 43, 44, 45, the second inverter 40', the second first set of resistors 41', 42', 43', 44', 45', the third inverter 40", and the third set of resistors 41", 42", 43", 44", 45". The schematic shown in FIG. 2 is a flat data representation of the circuit, as every element is shown. Storage of the flat data representation of the entire model in the computer system requires substantial memory, so other methods are sometimes employed.

Figure 3:
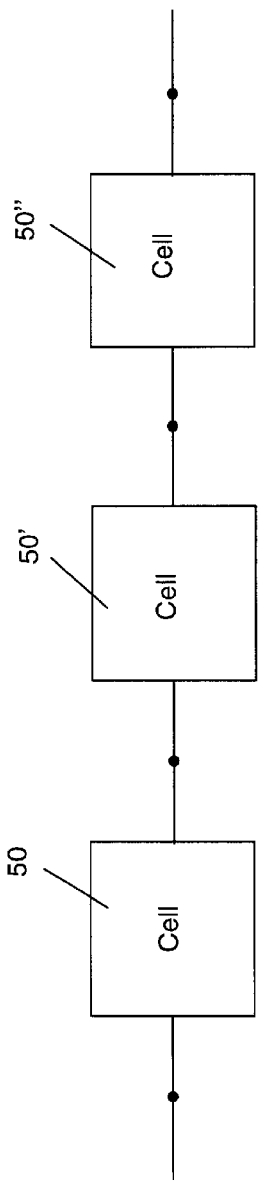
FIG. 3 shows a hierarchical representation a schematic of multiple cells.

FIG. 3 shows a hierarchical schematic of the example of the flat data representation of FIG. 2. Rather than specifying each of the components of a segment 10, the cell 50 shown in FIG. 1 is utilized, and three cells 50, 50', 50" are connected in series. This hierarchical representation requires less memory because it stores the cell information only once and references it thereafter. For example, each resistor may require 32 bytes of memory to store its information. A flat representation of the entire design would require substantial memory and would repeat the same 32 bytes of information for every resistor and other component each time they appear in the design. A hierarchical design stores the cell 50 information in memory once and references that cell using an address pointer, which requires less memory. An address pointer includes any type of database link or association.

Figure 4A:
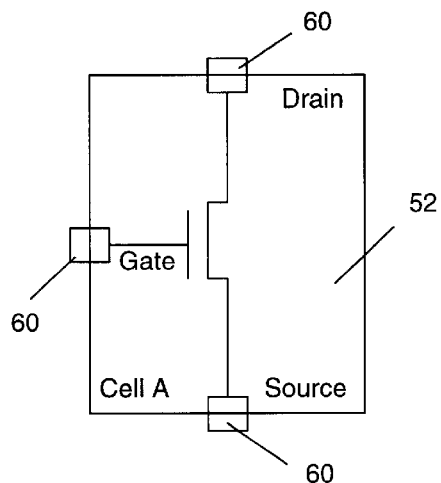
FIGS. 4A and 4B show primitive cells.
Figure 4B:
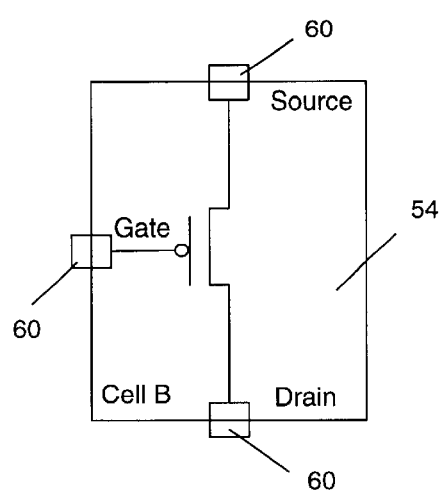

FIGS. 4A and 4B show examples of primitive cells used in a circuit design. FIG. 4A shows a primitive cell 52 for an n-type field effect transistor (NFET), labeled Cell A. The cell 52 is primitive in that it has no hierarchy. It contains the basic circuit element—in this case, the NFET having gate, source, and drain connections. The cell 52 has a plurality of ports 60 for connection to other cells in the design. In this example, there is a port 60 for each terminal of the NFET. FIG. 4B shows a primitive cell 54 for a p-type FET (PFET), labeled Cell B. In use, a design may store the attributes of the cells 52, 54 just once, and future uses of these same FETs is done using an address pointer to the memory location of the cells 52, 54. This conserves memory by storing the circuit details only once.

Figure 5:
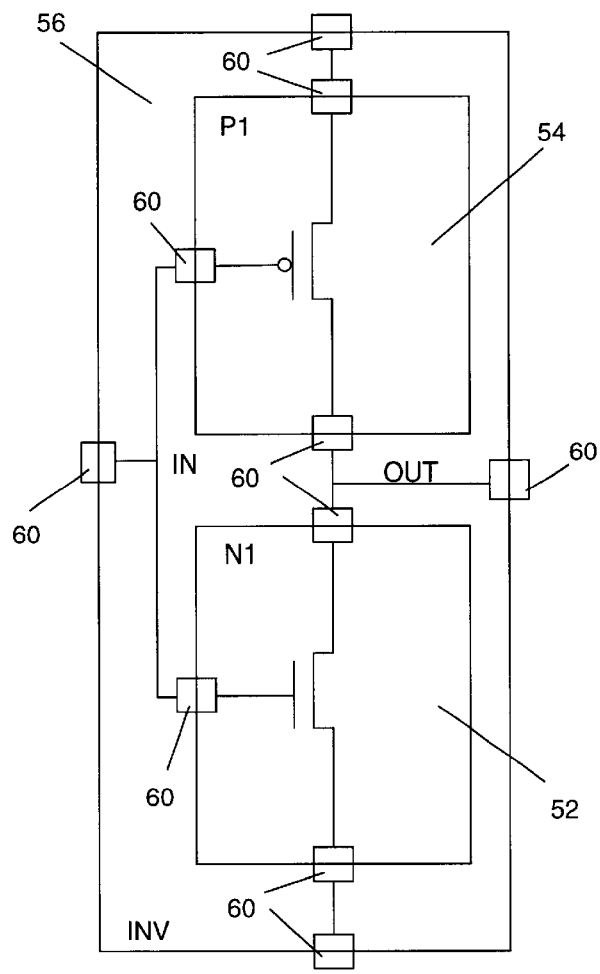
FIG. 5 shows a hierarchical cell model using the cells of FIGS. 4A and 4B.

FIG. 5 shows a hierarchical cell 56, labeled INV. This cell 56 is an inverter comprised of input and output ports 60, labeled "In" and "Out," an NFET connected between the output and a low voltage, and a PFET connected between the output and a higher voltage. The INV cell 56 has a plurality of ports 60 for connecting the device to the circuit, and it also has the internal ports 60 of the constituent cells 52, 54. The INV cell 56 is hierarchical because it comprises other cells, namely Cells A and B 52, 54 shown in FIGS. 5A and 5B. In memory, the INV cell 56 stores port and connection information, and references Cells A and B 52, 54 using an address pointer. This cell within a cell concept creates the hierarchy and conserves memory.

Figure 6:
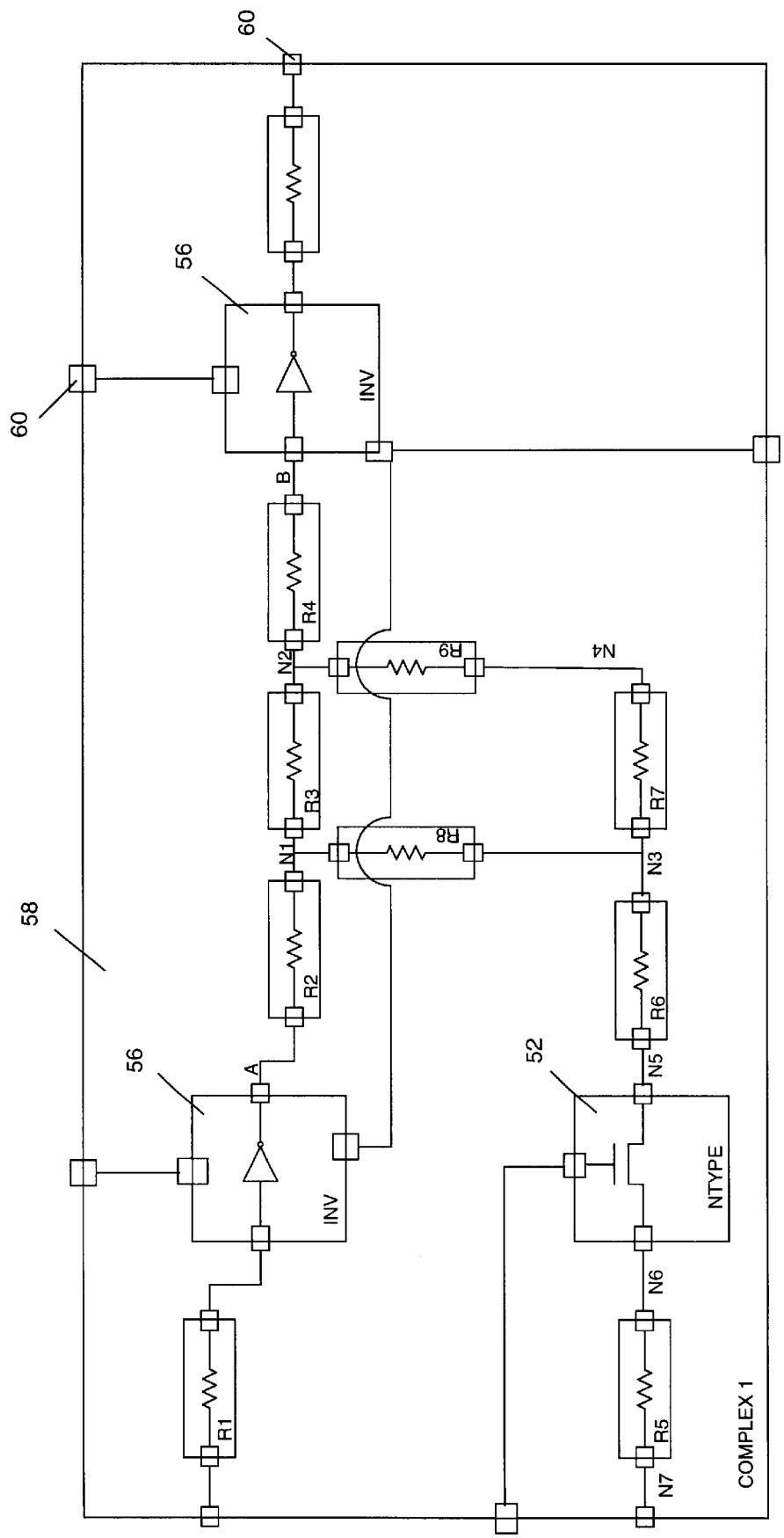
FIG. 6 shows a more complex hierarchical cell model of a circuit portion using the cells of FIGS. 4A, 4B, and 5.

FIG. 6 shows a more complex cell design labeled Complex1. The cell 58 has a plurality of ports 60 and contains various resistors, inverters, FETs, and other devices. As used herein, "devices" refer broadly to any circuit element. Each box in FIG. 6 is an instance of a particular cell 50, which itself may contain instances of other cells 50. The inverters 56 are cells 50, such as the inverter cell 56 shown in FIG. 5, having their own hierarchy. Similarly, the NTYPE FET cell 52 may be of the type shown in FIG. 4A. In memory, the complex cell 58 contains references to the memory location of the inverter cell 56, which in turn has the memory references to the FET cells 52, 54. This hierarchy saves memory because each cell is stored once, and instances merely refer back to the cell that describes them, using address pointers.

In use, the circuit model, such as the Complex1cell 58 portion shown in FIG. 6, is analyzed using an E-CAD tool. The tool analyzes the performance of the circuit design by accessing the information stored in memory. The tool might examine, for example, the current through a particular portion of the design. In another example, the tool may simply check the connectivity of the design portion. In its analysis, the tool may traverse the circuit design from one node to another. For example, in the design portion shown in FIG. 6, an E-CAD tool might traverse the design from node A to node B to analyze the performance of that path. The selected portion may be defined as a signal from a starting terminal (Node A) to an end terminal (Node B). Two nodes may have multiple paths connecting them, caused by loops in the circuit design. To traverse the design, it is helpful for the E-CAD tool to know all of the paths between the nodes and to know which paths have already been analyzed. As devices are analyzed, they are marked to indicate that they have already been processed to avoid looping and analyzing the same device more than once.

In its analysis, the tool considers the properties of the devices along the traverse—for example, all of the resistors and other devices between nodes A and B. This involves reading the device information stored in the memory. When the design contains hierarchical devices, such as the inverters, the E-CAD tool reads the data stored in memory and uses the address pointers to access the primitive cells.

Figure 7:
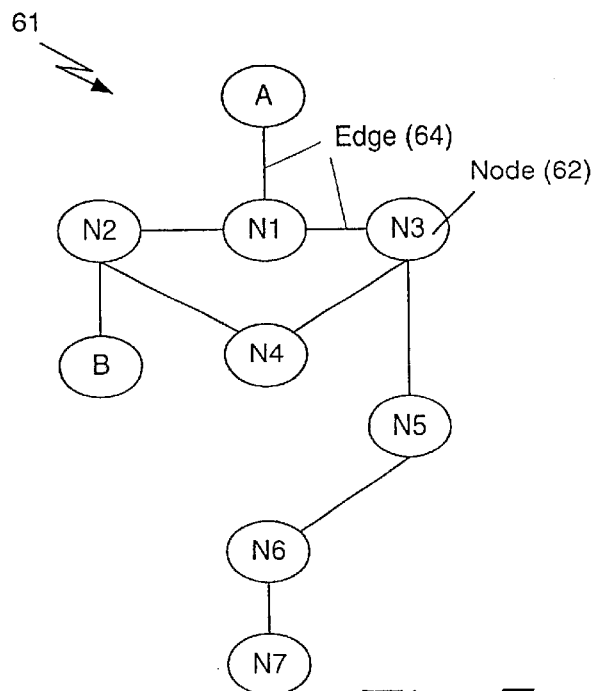
FIG. 7 shows a graphical representation used by the method.

FIG. 7 shows an graphical representation of the signal paths between nodes A and B. This graph 61 is a representation of the flat representation data structure stored in a memory for analysis by an E-CAD tool. The graph 61 is created to overlay the hierarchical circuit design model. The flat representation refers to the connections by nodes and edges. Nodes 62 are the connectors between devices, such as nodes A and B. The individual nodes 62 shown in FIG. 7, $N_1$ through $N_7$, correspond to the nodes (also referred to as "nets") shown in FIG. 6. Edges 64 refer to the devices between the nodes, such as the resistors and cells in the example shown. Information is stored for each node 62 and edge 64 under test.

Figure 8A:
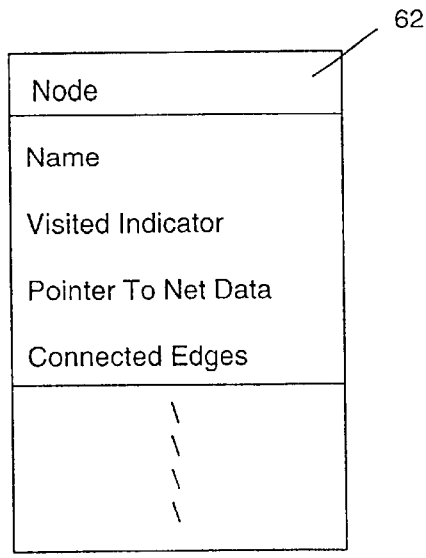
FIGS. 8A and 8B show data structures for node and edge data stored by the method.
Figure 8B:
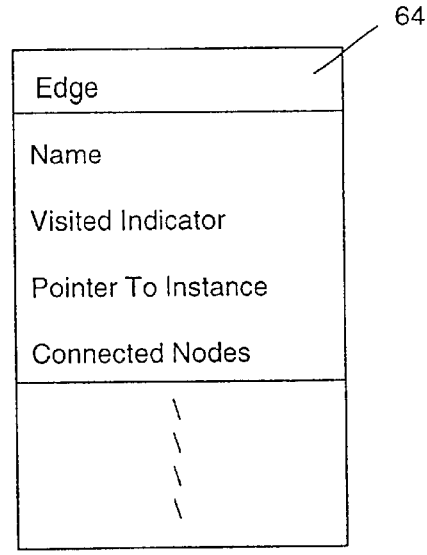

FIGS. 8A and 8B show the data format of the nodal and edge information that is stored. FIG. 8A shows the information stored for a node 62. Each node 62 contains the name of the logical net that it represents, a marker to indicate whether the node 62 has been analyzed, or visited, by the E-CAD tool, and a data address pointer to the actual net data in the circuit design. As used herein, the terms "node" and "net" are used interchangeably, with node sometimes referring to a data representation of a net. Also, the terms "device" and "edge" are used interchangeably, with edge sometimes referring to a data representation of a device. FIG. 8B shows the information stored for an edge 64. Each edge 64 contains the name of the instance it represents, a marker to indicate whether the edge 64 has been visited, and a data address pointer to the actual instance of the edge in the design. Also, to connect the graph 61, the nodes 62 contain a list of the edges 64 connected to them, and the edges 64 contain a list of the nodes 62 they connect. These connectivity lists may be address pointers, referred to herein as connection address pointers.

Figure 9A:
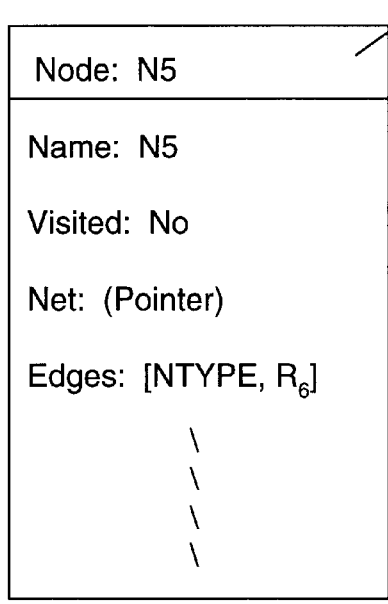
FIGS. 9A and 9B show example data stored for nodes and edges of the design of FIG. 6.
Figure 9B:
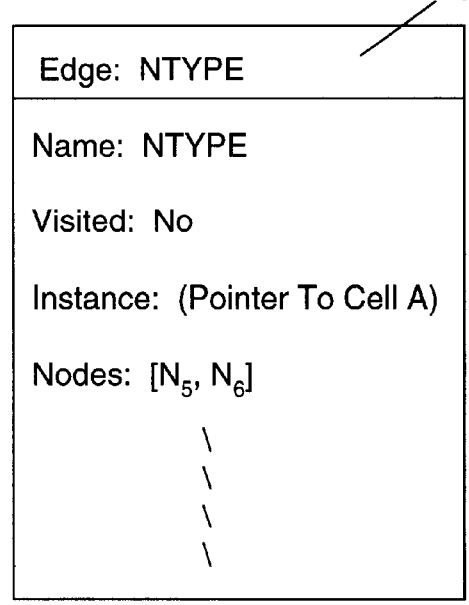

FIGS. 9A and 9B show examples of information stored for nodes 62 and edges 64 of the design shown in FIG. 6. Node $N_5$ is shown in FIG. 9A. FIG. 6 shows the node $N_5$ connected between resistor $R_6$ and FET NTYPE 52. In FIG.

9A, the name of the node 62 is stored as $N_5$, and it is indicated to not yet have been processed. A reference to the actual net data is also included, along with the edge connections. In this example, the edge connections include NTYPE and $R_6$. In FIG. 9B, edge data for the edge 64 named NTYPE is stored, along with an indication that this edge 64 has not yet been visited by the E-CAD tool. The data references the instance of the underlying NTYPE data, using a pointer to cell A shown in FIG. 4A. The data also stores the names of the connected nodes $N_5$ and $N_6$.

Figure 10:
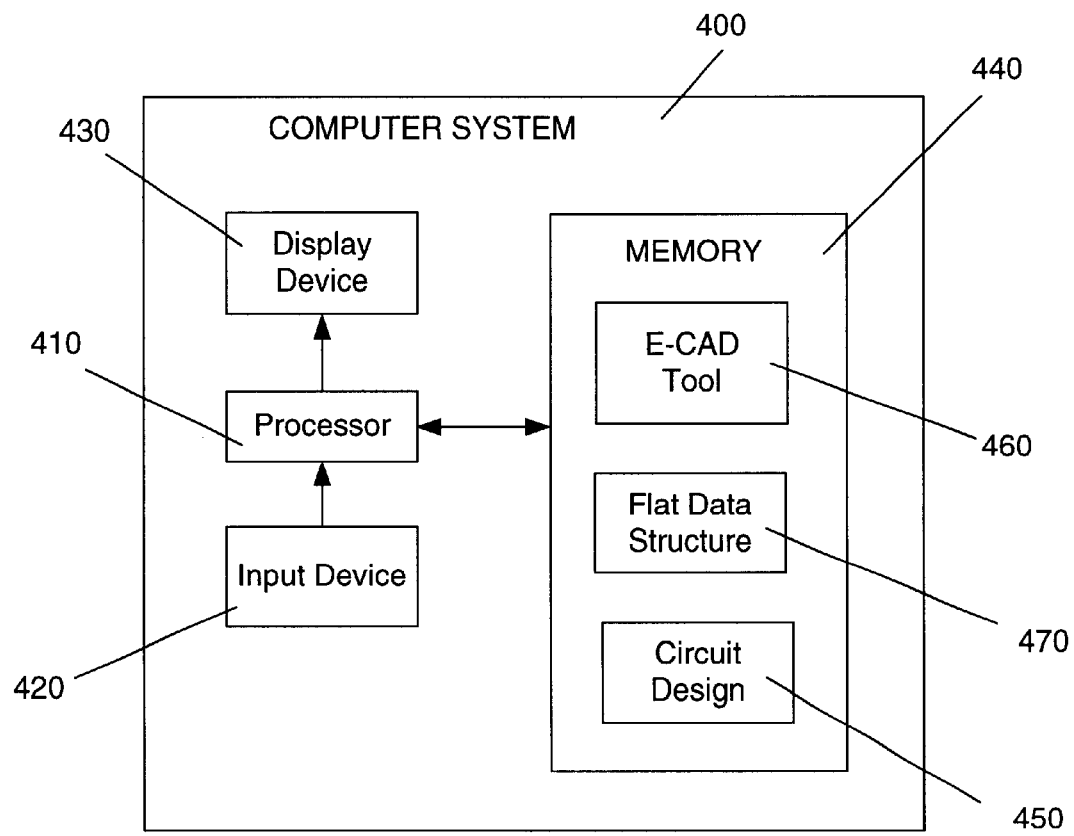
FIG. 10 shows a block diagram of a computer system that performs the method.

FIG. 10 shows a block diagram of a computer system 400 having a processor 410 connected to an input device 420 and a display device 430. The processor 410 accesses memory 440 in the computer system 400 that stores a VLSI circuit design 450. The design 450 may be stored in a data file, sometimes referred to as a "resistance-capacitance netlist" or an "RC netlist." An E-CAD tool 460 is also stored in the memory 440 for analyzing the circuit model 450. The circuit model 450 may be a hierarchical model that uses cells 50, as described herein. In use, the input device 420 receives commands instructing the processor 410 to call the E-CAD tool software 460 to perform a circuit analysis on the model 450. The results of the analysis may be displayed on the display device 430. During the application of the E-CAD tool 460 on the hierarchical circuit design 450 using the method, a flat data representation 470 is created and stored in memory 440. The data representation 470 uses a data structure that uses address pointers to store information about the nodal and edge connections of the design 450. The data structure 470 may be similar to the data structures described in FIGS. 8A and 8B.

Figure 11:
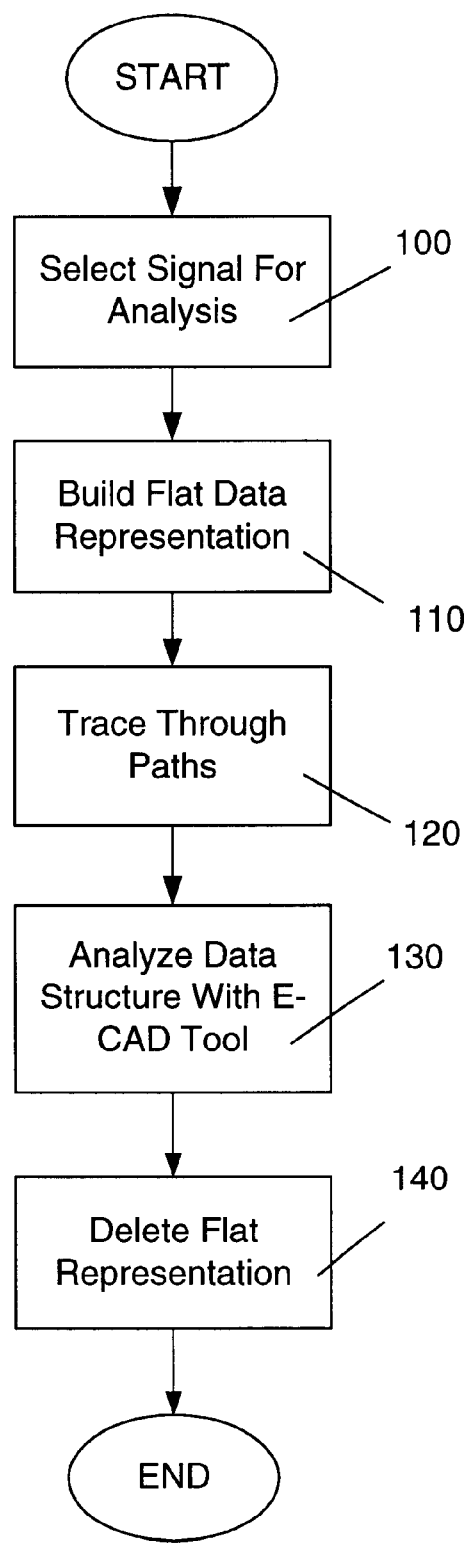
FIG. 11 shows a flow chart of the method.

FIG. 11 shows a flow chart of the method for analyzing the design 450 stored in memory 440 of the computer system 400. The method may be implemented in, for example, software modules such as the E-CAD tool 460 stored in memory 440 for execution by processor 410. A hierarchical design database 450 is read into the E-CAD tool 460 for analysis. A portion of the circuit design 450 is selected 100 for analysis. The selection may be a signal defined by two terminal nodes in the circuit design 450, such as nodes A and B in FIG. 6. A flat data structure 470 is then created 110 in memory 440 to represent the paths in the selected signal. The paths of the signal are traced 120 and marked as they are visited by the E-CAD tool 460. The E-CAD tool 460 analyzes 130 the signal and deletes 140 the flat representation 470 from memory 440.

Figure 12:
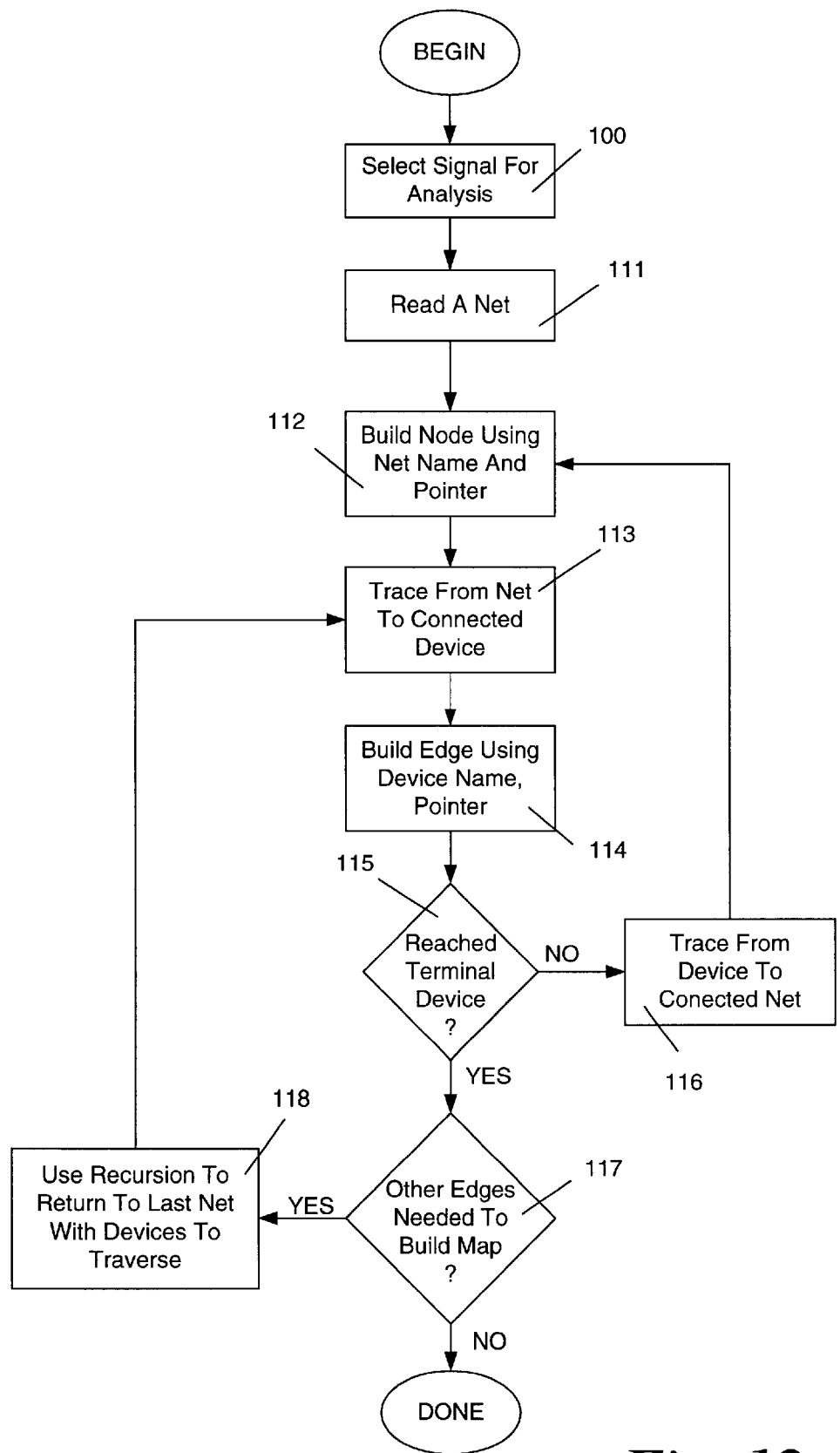
FIG. 12 shows a more detailed flow chart of the method shown in FIG. 11.

FIG. 12 shows a more detailed analysis of the method for building 110 the flat representation 470. After a signal is selected 100 for analysis, the E-CAD tool 460 reads 111 a net. A "net" refers to an idealized connection between devices or cells in a design 450. A node 62 is built 112 to represent the net in the flat representation 470. The flat representation data structure 470 stores a name of the node 62 and connection information. The data structure 470 contains information shown in FIG. 8A. The representation 470 also stores a data address pointer to the location in the hierarchical database 450 that stores the underlying data for the node 62, and an indication of whether the node 62 has been analyzed by the tool 460. Using the connection information, the method then traces 113 the signal to the next connected device or cell 50. An edge 64 is created 114 to represent the device in the flat data representation 470. An "edge" refers to any data structure that stores information about a device or cell 50 in the flat representation 470. By definition, nets (mapped as nodes) lie between devices (mapped as edges). The data structure 470 stores a name of the device as the edge name and stores connection information 120. The data structure 470 contains information shown in FIG. 8B. The representation 470 also stores a data address pointer to the location in the hierarchical database 450 that stores the underlying data for the edge 64, and an indication of whether the edge 64 has been analyzed by the tool 460.

The method then determines 115 whether it has reached the end terminal device for the signal analyzed. The terminal refers to any specified end point of the signal or design analysis. If it has not reached the terminal, then it traces 116 the connectivity to the next net and builds 112 a node for the net. Once the method reaches the terminal device, it determines 117 whether any other edges require mapping. For example, the map may involve multiple loops in the circuit 450 that must be followed. The tool 460 "backs up" from the terminal looking for additional nets and devices to be mapped. Using a recursion process, the method returns 118 to the last net having devices to traverse. and continues the trace 113 to the next device. The process continues until all paths are mapped.

Conventional E-CAD software programs are known in the art and the method shown in FIGS. 11 and 12 may be implemented, for example, by modifying such conventional software programs, or by including appropriate instructions in any E-CAD software tool. The modifications may include, for example, instructions to create and store the flat representation of the signal of interest and subsequently delete it from memory after analysis of it.

Although the present invention has been described with respect to particular embodiments thereof, variations are possible. The present invention may be embodied in specific forms without departing from the essential spirit or attributes thereof. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or read-only memory (ROM). It is desired that the embodiments described herein be considered in all respects illustrative and not restrictive and that reference be made to the appended claims and their equivalents for determining the scope of the invention.

We claim:

1. A method of analyzing a circuit design stored in a memory, on a signal-by signal basis, the method comprising:
   reading a hierarchical database that stores a circuit design;
   selecting for testing signals within a portion of the design, the signals being defined by terminal nodes; and
   for each of the signals in the portion,
      creating a flat representation of nodes and edges along the signal, using the circuit design;
      performing a test on the flat representation of the signal; and
      deleting the flat representation of the signal before analyzing another signal in the portion.

2. The method of claim 1, wherein the step of performing comprises performing the test using an electronic computer-aided design (E-CAD) tool.

3. The method of claim 1, wherein the step of creating comprises storing the flat representation in memory.

4. The method of claim 3, further comprising deleting the flat representation from memory.

5. The method of claim 1, further comprising recording a result of the circuit analysis.

6. A computer-readable medium having computer-executable instructions for performing a method for analyzing a computer representation of a circuit design having a plurality of layout segments, the method comprising:

reading a hierarchical database that stores information about a circuit design comprising signals defined by terminal nodes;

creating a flat representation of one of the signals in the circuit design by storing nodal information for a node along the one of the signals, the nodal information including a data address pointer to a location in the hierarchical database that stores underlying nodal design information; and by storing edge information for an edge along the one of the signals, the edge information including a data address pointer to a location in the hierarchical database that stores underlying edge design information;

analyzing the flat representation;

deleting the flat representation; and after deleting the flat representation, repeating the steps of creating, analyzing, and deleting on another of the signals.

7. The medium of claim 6, wherein the step of analyzing comprises using an electronic computer-aided design (E-CAD) tool to analyze the flat representation of the signal.

8. The medium of claim 6, wherein the step of creating comprises storing the flat representation in memory of a computer system.

9. The medium of claim 6, wherein the nodal information further comprises a nodal connection address pointer to a memory location that stores information about an edge adjacent to a node, and wherein the edge information further comprises an edge connection address pointer to a memory location that stores information about a node adjacent to an edge.

10. A computer-readable medium having stored thereon a data structure that stores information about nodes and edges between terminal nodes of a selected signal in a circuit design stored in a memory, the data structure comprising:

a name of a node or edge between terminal nodes of a selected signal in a circuit design stored in a memory;

a data address pointer to a location in the memory that stores data associated with the node or edge; and if the name is an edge, a connection address pointer to a location in the data structure of a node connected to the edge; and if the name is a node, a connection address pointer to a location in the data structure of an edge connected to the node.

11. The medium of claim 10, wherein the data structure further comprises an entry that indicates whether the node or edge has been analyzed.

12. The medium of claim 10, wherein the edge is any circuit element connected to a node.

13. The medium of claim 10, wherein the circuit design is a hierarchical circuit design.

14. The method of claim 1, wherein the step of creating comprises:

recursively tracing through the signal, along each path between the terminal nodes within the portion of the circuit; and while tracing through the signal, creating a node for each net along the signal and creating an edge for each device along the signal, each of the nodes and edges having a name and an address pointer to a location in the hierarchical database.

15. The method of claim 14, wherein the step of recursively tracing comprises:

tracing upstream from a downstream terminal node toward an upstream terminal node until reaching the upstream terminal node or a terminal device; and recursively tracing paths along the signal after reaching the upstream terminal node or the terminal device.

16. The method of claim 15, wherein the step of creating further comprises:

reading a first net on a first path;

creating a first node for the first net;

advancing to a first device adjacent the first net;

creating a first edge for the first device;

advancing to another net that is an input of the first device, unless the first device is a terminal device;

if the first device is a terminal device,
    backtracing from the first net to a downstream device; and
    tracing a second path connected to an input of the downstream device.

17. The method of claim 6, wherein the step of creating comprises:

recursively tracing through the signal, along paths between the terminal nodes; and while tracing through the signal, creating a node for each net along the signal and creating an edge for each device along the signal, each of the nodes and edges having a name and an address pointer to a location in the hierarchical database.

18. The method of claim 17, wherein the step of recursively tracing comprises:

tracing upstream from a downstream terminal node toward an upstream terminal node until reaching the upstream terminal node or a terminal device; and recursively tracing paths along the signal after reaching the upstream terminal node or the terminal device.

19. The method of claim 18, wherein the step of recursively tracing comprises:

creating nodes and edges for each net and device, respectively, along one of the paths until reaching the upstream node or a terminal device; and after reaching the upstream node or terminal device, backtracing to another path.

20. The medium of claim 10, wherein the data structure comprises:

names of a plurality of nodes and edges between terminal nodes of the selected signal in a portion of the circuit design stored in the memory, wherein the terminal nodes include a downstream terminal node and an upstream terminal node, and wherein each of the plurality of nodes and edges between the upstream and downstream terminal nodes is derived from recursively tracing along paths from the downstream node until reaching the upstream node or a terminal device;

data address pointers to locations in the memory that store data associated with at least one of the nodes and edges;

for each of names of edges, a connection address pointer to the location in the data structure of the nodes connected to the each of the edges; and for each of names of edges, a connection address pointer to the location in the data structure of the edges connected to the each of the nodes.

* * * * *